United States Patent
Oguri et al.

(10) Patent No.: US 9,156,539 B2
(45) Date of Patent: Oct. 13, 2015

(54) AIRCRAFT WINDOW MEMBER, METHOD OF MANUFACTURING THE SAME, AND AIRCRAFT WINDOW ASSEMBLY

(75) Inventors: Kazuyuki Oguri, Nagoya (JP); Katsuto Okada, Kasugai (JP)

(73) Assignee: MITSUBISHI HEAVY INDUSTRIES, LTD., Tokyo (JP)

( * ) Notice: Subject to any disclaimer, the term of this patent is extended or adjusted under 35 U.S.C. 154(b) by 1538 days.

(21) Appl. No.: 12/525,912

(22) PCT Filed: Feb. 18, 2008

(86) PCT No.: PCT/JP2008/052676
§ 371 (c)(1),
(2), (4) Date: Aug. 5, 2009

(87) PCT Pub. No.: WO2008/102737
PCT Pub. Date: Aug. 28, 2008

(65) Prior Publication Data
US 2010/0304069 A1 Dec. 2, 2010

(30) Foreign Application Priority Data
Feb. 19, 2007 (JP) .................................. 2007-037858

(51) Int. Cl.
*B64C 1/14* (2006.01)
*H05K 9/00* (2006.01)
*B64D 45/00* (2006.01)

(52) U.S. Cl.
CPC ............ *B64C 1/1484* (2013.01); *H05K 9/0086* (2013.01); *H05K 9/0094* (2013.01); *B64D 2045/006* (2013.01); *Y10T 156/10* (2015.01); *Y10T 442/10* (2015.04)

(58) Field of Classification Search
CPC ...................................................... B64C 1/1484
USPC .......................................... 244/129.1, 129.3
See application file for complete search history.

(56) References Cited

U.S. PATENT DOCUMENTS 2,464,826 A * 3/1949 Neher et al. .................. 428/501
RE25,202 E 7/1962 Clapp et al.
(Continued)

FOREIGN PATENT DOCUMENTS

| | | |
|---|---|---|
| CN | 1196317 | 10/1998 |
| JP | 11-354968 | 12/1999 |

(Continued)

OTHER PUBLICATIONS

Japanese Office Action issued Nov. 29, 2011 in corresponding Japanese Patent Application No. 2007-37858 with English translation.

(Continued)

*Primary Examiner* — Brian M O'Hara
*Assistant Examiner* — Michael Kreiner
(74) *Attorney, Agent, or Firm* — Wenderoth, Lind & Ponack, L.L.P.

(57) ABSTRACT

An aircraft window member includes film made of acrylic resin, a conductive mesh, which is formed on the film and in which a conductive material, is formed in a mesh shape so as to have optical transparency for ensuring visibility and to have electromagnetic-wave shielding properties, and a window main body, which is made of acrylic resin, and to which the film on which the conductive mesh is formed is attached.

5 Claims, 2 Drawing Sheets

(56) References Cited

U.S. PATENT DOCUMENTS

| | | | |
|---|---|---|---|
| 3,238,909 A | 3/1966 | Kendall | |
| 3,431,348 A | 3/1969 | Nellis et al. | |
| 3,458,614 A | 7/1969 | Knoll | |
| 3,631,580 A | 1/1972 | Swartz | |
| 4,081,581 A * | 3/1978 | Littell, Jr. | 428/138 |
| 4,361,527 A | 11/1982 | Rau | |
| 4,504,341 A * | 3/1985 | Radzwill et al. | 156/102 |
| 4,721,636 A * | 1/1988 | Hood et al. | 428/38 |
| 4,812,359 A * | 3/1989 | Hall | 428/332 |
| 4,920,254 A * | 4/1990 | DeCamp et al. | 219/547 |
| 5,143,793 A | 9/1992 | Masse et al. | |
| 5,165,965 A | 11/1992 | Martin | |
| 5,194,985 A * | 3/1993 | Hilton, Sr. | 359/350 |
| 5,253,175 A | 10/1993 | Machii et al. | |
| 5,376,443 A * | 12/1994 | Sijan et al. | 428/332 |
| 5,470,413 A * | 11/1995 | Cedarleaf | 156/90 |
| 5,670,742 A | 9/1997 | Jones | |
| 5,876,577 A | 3/1999 | McAleer et al. | |
| 6,028,699 A | 2/2000 | Fisher | |
| 6,239,360 B1 * | 5/2001 | Kato et al. | 174/351 |
| 6,399,879 B1 | 6/2002 | Ueda et al. | |
| 6,495,752 B1 | 12/2002 | Sugizaki et al. | |
| 6,504,501 B2 * | 1/2003 | Tsuno et al. | 342/1 |
| 6,544,634 B1 | 4/2003 | Abrams et al. | |
| 6,756,126 B2 * | 6/2004 | Oguri et al. | 428/447 |
| 6,787,204 B2 * | 9/2004 | Chaussade et al. | 428/34 |
| 7,350,753 B2 * | 4/2008 | Guidon et al. | 244/129.3 |
| 7,611,746 B2 * | 11/2009 | Funaki et al. | 427/96.3 |
| 7,674,417 B2 * | 3/2010 | Oguri | 264/295 |
| 2003/0087048 A1 | 5/2003 | Chaussade et al. | 428/34 |
| 2004/0116013 A1 * | 6/2004 | Yoshida et al. | 442/43 |
| 2004/0229607 A1 * | 11/2004 | La Chapelle et al. | 455/431 |
| 2005/0170083 A1 * | 8/2005 | Oguri | 427/164 |
| 2007/0011863 A1 * | 1/2007 | Yoshikawa | 29/592.1 |
| 2007/0075187 A1 | 4/2007 | Bold | |
| 2009/0014589 A1 * | 1/2009 | Guidon et al. | 244/129.3 |

FOREIGN PATENT DOCUMENTS

| | | |
|---|---|---|
| JP | 2000-034451 | 2/2000 |
| JP | 2000-174486 | 6/2000 |
| JP | 2001-189589 | 7/2001 |
| JP | 2004-117545 | 4/2004 |
| JP | 2004-146536 | 5/2004 |
| JP | 2005-104310 | 4/2005 |
| JP | 2005-142500 | 6/2005 |
| JP | 2005-277438 | 10/2005 |
| WO | 02/101774 | 12/2002 |
| WO | 03/045126 | 5/2003 |
| WO | 2005/115840 | 12/2005 |

OTHER PUBLICATIONS

Office Action issued Aug. 15, 2011 in corresponding Chinese Application No. 200880005106.3 w/English translation.
Chinese Office Action issued Apr. 6, 2012 in corresponding Chinese Patent Application No. 200880005106.3 with English translation.
International Search Report mailed Apr. 8, 2008 for International Application No. PCT/JP2008/052676.
Supplementary European Search Report issued Jan. 17, 2013 in corresponding European Application No. 08 71 1500.
Notification of Grant of Invention Patent issued Feb. 1, 2013 in corresponding Chinese Application No. 200880005106.3.
Decision to Grant a European patent pursuant to Article 97(1) EPC issued Mar. 20, 2014 in corresponding European patent application No. 08711500.2.

* cited by examiner

AIRCRAFT WINDOW MEMBER, METHOD OF MANUFACTURING THE SAME, AND AIRCRAFT WINDOW ASSEMBLY

BACKGROUND OF THE INVENTION

I. Technical Field

The present invention relates to an aircraft window member, a method of manufacturing the same, and an aircraft window assembly.

II. Description of the Related Art

In order to ensure visibility outside an aircraft for the crew and passengers in the aircraft, aircraft window members are frequently used for canopies and cabin windows, for example. Endowing such aircraft window members with electromagnetic-wave shielding properties has been examined in order to avoid penetration of harmful electromagnetic waves from the outside of the aircraft or to prevent electromagnetic waves originating in the aircraft from leaking to the outside.

A known example of such aircraft window members having electromagnetic-wave shielding properties is described in Japanese Unexamined Patent Application, Publication No. 2005-104310 (FIG. 5). Japanese Unexamined Patent Application, Publication No. 2005-104310 (FIG. 5) discloses a manufacturing method in which a metal mesh for electromagnetic-wave shielding is formed on a film and is then attached to a window main body.

SUMMARY OF THE INVENTION

However, when polyethylene terephthalate (PET), which is generally used for a resin film, is applied to the above-mentioned aircraft window members, the following problems arise.

Acrylic resin is used for the window main body of each of the aircraft window members, and acrylic resin and PET have a large difference in thermal expansion coefficient. Therefore, when heat treatment is applied after the film is attached to the window main body, wrinkles may occur due to the difference in thermal expansion coefficient. Furthermore, the film may be peeled from the window main body during the operation of the aircraft because of a large temperature difference between when it is on the ground and when it is flying, which is undesirable in terms of durability.

The present invention has been made in view of those circumstances, and an object of the present invention is to provide an aircraft window member excellent in durability, a method of manufacturing the same, and an aircraft window assembly.

In order to solve those problems described above, the aircraft window member, the method of manufacturing the same, and the aircraft window assembly of the present invention employ the following solutions.

Specifically, an aircraft window member according to the present invention includes: a film made of acrylic resin; a conductive mesh which is formed on the film and in which a conductive material is formed in a mesh shape so as to have optical transparency for ensuring visibility and to have electromagnetic-wave shielding properties; and a window main body which is made of acrylic resin and to which the film on which the conductive mesh is formed is attached.

Since the window main body and the film are made of acrylic resin, they have an equivalent thermal expansion coefficient. Therefore, even when they are heated and cooled during manufacturing, hardly any wrinkles occur. Furthermore, although the aircraft window member is exposed to a large change in temperature during the operation of the aircraft, since there is no difference in thermal expansion coefficient between the window main body and the film, peeling of the film almost never occurs, thus improving the durability.

Further, the aircraft window member according to the present invention may have a configuration in which an adhesive layer is formed between the film on which the conductive mesh is formed and the window main body; and the adhesive layer is made of urethane adhesive.

Although polyvinyl butyral (PVB) is generally used as adhesive for laminated glass used in vehicles etc., PVB is not preferable in terms of its adhesive strength with acrylic resin. In contrast, urethane adhesive has sufficient adhesive strength to bond the film made of acrylic resin to the window main body made of acrylic resin. It is preferable that film-like polyurethane be used as the urethane adhesive used in the present invention.

Furthermore, according to the aircraft window member of the present invention, the conductive mesh formed on the film may be located between the film and the window main body.

Since the conductive mesh formed on the film is located between the film and the window main body, the conductive material of the conductive mesh and the adhesive layer are brought into direct contact. Urethane adhesive is used as the adhesive layer, and the urethane adhesive does not include plasticizer, unlike PVB. Therefore, a reaction does not occur between the conductive material of the conductive mesh and the adhesive layer, and there is no adverse influence on the optical transparency of the window member.

Furthermore, the aircraft window member according to the present invention may have a configuration in which the conductive mesh is located above the window main body with the film therebetween; and a protective layer is formed on the conductive mesh in such a manner as to provide an exposed region used for an electrical connection at an edge portion of the conductive mesh.

When the conductive mesh formed on the film does not face the window main body but is located at the side opposite to the window main body with the film therebetween, it is necessary to laminate the protective layer to protect the conductive mesh. If the exposed region which is not covered with the protective layer is provided at the edge portion of the conductive mesh when the protective layer is laminated, it is possible to obtain an electrical connection for electromagnetic-wave shielding by using the exposed region for the electrical connection.

Furthermore, an aircraft window assembly according to the present invention includes: any of the aircraft window members described above; and a window frame which holds the aircraft window member.

Since any of the aircraft window members described above is included, the aircraft window assembly excellent in durability can be provided.

Furthermore, an aircraft-window-member manufacturing method according to the present invention includes attaching a film that is made of acrylic resin and that holds a conductive mesh in which a conductive material is formed in a mesh shape so as to have optical transparency for ensuring visibility and to have electromagnetic-wave shielding properties, to a window main body made of acrylic resin.

The aircraft window member can be simply manufactured just by attaching the film to the window main body. Even when the window main body has a curved face, the film can be easily attached thereto because the film has flexibility.

Since the window main body and the film are made of acrylic resin, they have an equivalent thermal expansion coefficient. Therefore, even when they are heated and cooled during manufacturing, hardly any wrinkles occur. Furthermore, although the aircraft window member is exposed to a large change in temperature during the operation of the aircraft, since there is no difference in the thermal expansion coefficient between the window main body and the film, peeling of the film almost never occurs, thus improving the durability.

Furthermore, in the aircraft-window-member manufacturing method according to the present invention, the film may be attached to the window main body after an adhesive layer made of urethane adhesive is provided on the window main body.

Although polyvinyl butyral (PVB) is generally used as adhesive for laminated glass used in vehicles etc., PVB is not preferable in terms of its adhesive strength with acrylic resin. In contrast, urethane adhesive has sufficient adhesive strength to bond the film made of acrylic resin to the window main body made of acrylic resin.

Furthermore, in the aircraft-window-member manufacturing method according to the present invention, the film may be attached to the window main body so as to locate the conductive mesh between the film and the window main body.

Since the conductive mesh formed on the film is located between the film and the window main body, the conductive material of the conductive mesh and the adhesive layer are brought into direct contact. Urethane adhesive is used as the adhesive layer, and the urethane adhesive does not include plasticizer, unlike PVB. Therefore, a reaction does not occur between the conductive material of the conductive mesh and the adhesive layer, and there is no adverse influence on the optical transparency of the window member.

Furthermore, the aircraft-window-member manufacturing method according to the present invention may have a configuration in which the film is attached to the window main body so as to locate the conductive mesh above the window main body with the film therebetween; and a protective layer is formed on the conductive mesh in such a manner as to provide an exposed region used for an electrical connection at an edge portion of the conductive mesh.

Since the exposed region used for an electrical connection is provided at the edge portion of the conductive mesh, an electrical connection for electromagnetic-wave shielding can be obtained.

According to the present invention, the following advantages are obtained.

Since the window main body and the film are made of acrylic resin, an aircraft window member having high durability can be provided.

Since urethane adhesive is used to bond the film and the window main body, they can be firmly bonded. Even when the adhesive layer and the conductive layer are brought into direct contact, the transmittance for ensuring visibility is not reduced.

When the protective layer is laminated on the conductive mesh, the exposed region is provided at the edge portion of the conductive mesh so as to obtain an electrical connection. Therefore, electromagnetic waves can be reliably shielded.

DETAILED DESCRIPTION OF THE INVENTION

Embodiments of the present invention will be described below with reference to the drawings.

First Embodiment

A first embodiment of the present invention will be described below with reference to FIGS. 1 to 3.

Figure 1:
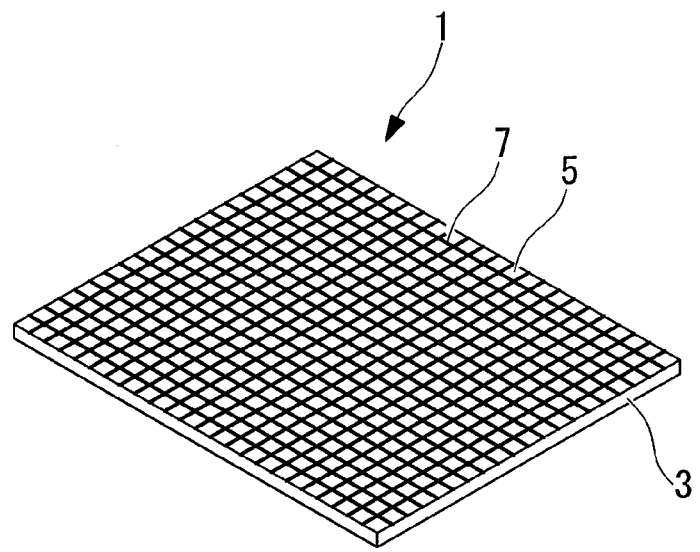
FIG. 1 is a perspective view showing an aircraft window member according to a first embodiment of the present invention.

FIG. 1 shows an aircraft window member used for a cabin window, for example. Note that an aircraft window member 1 shown in FIG. 1 is flat, but it may be curved depending on the position at which it is installed.

The aircraft window member 1 includes a window main body 3 serving as a base, a film 5 attached to the window main body 3, and a conductive mesh 7 formed on the film 5. With the conductive mesh 7, the aircraft window member 1 has electromagnetic-wave shielding properties and also has optical transparency to ensure visibility. For example, the transmittance for visible light is about 90%.

Figure 2:
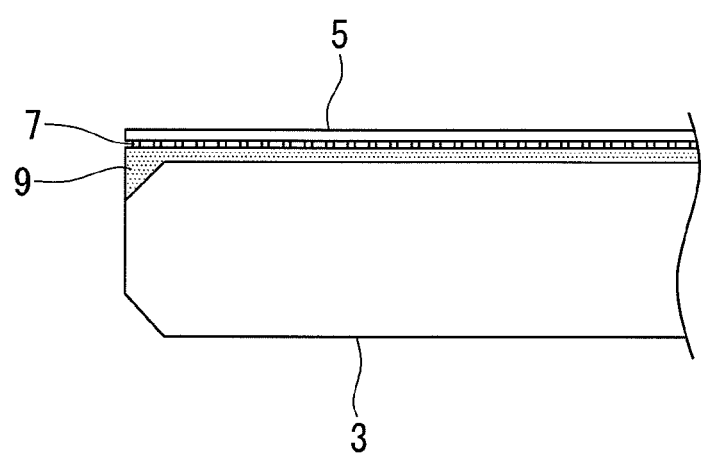
FIG. 2 is a partial cross-sectional view showing an edge portion of the aircraft window member shown in FIG. 1.
Figure 3:
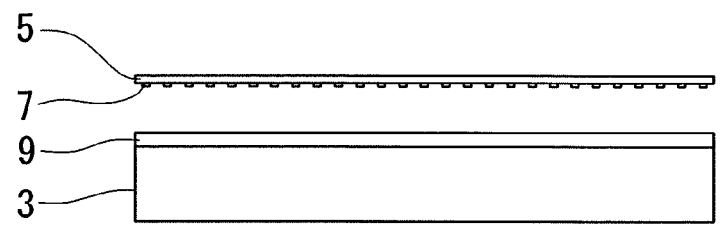
FIG. 3 is a cross-sectional view showing part of a process of manufacturing the aircraft window member shown in FIG. 2.

FIG. 2 is a partial cross-sectional view showing an edge portion of the aircraft window member 1.

As shown in FIG. 2, the film 5 and the conductive mesh 7 are laminated in this order on the window main body 3, with an adhesive layer 9 therebetween.

The window main body 3 is made of acrylic resin, more specifically, polymethyl methacrylate resin (PMMA).

The film 5 is made of acrylic resin, more specifically, polymethyl methacrylate resin (PMMA). In short, the same material as for the window main body 3 is used for the film 5. The thickness of the film 5 is 125 μm, for example.

The conductive mesh 7 is formed in a lattice. A preferable conductive material therefor is metal, and copper is used in this embodiment. The line width of the conductive mesh 7 is about 10 μm, the thickness thereof is about 10 μm, and the pitch thereof is about 300 μm. Such a line width, thickness, and pitch achieve both of electromagnetic-wave shielding properties and visibility.

The adhesive layer 9 is made of urethane adhesive. Film-like polyurethane is used as the urethane adhesive. After bonding, the adhesive layer 9 flows into the space between the film 5 and the conductive mesh and directly contacts the conductive material (copper) of the conductive mesh 7 to cover the region therearound.

Next, a method of manufacturing the aircraft window member 1 having the above-described structure will be described.

First, a copper thin film is laminated on one face of the film 5 by a plating method, for example. The thickness of the copper thin film is 10 μm, for example. Then, a resist film is formed on the surface of the copper thin film. Next, the resist film is exposed to light with a resist pattern and is then developed to form a mesh-shaped mask on the surface of the copper thin film. In this state, the copper is etched by using etchant and then the resist pattern is removed, thereby forming the mesh-shaped conductive mesh 7. In this way, the film 5 having the conductive mesh 7 is obtained as indicated by reference numerals 5 and 7 in FIG. 3.

After the adhesive layer 9, which is made of sheet-like urethane adhesive, is provided on the window main body 3, the film 5 is attached such that the conductive mesh 7 faces the window main body 3.

Next, heat treatment is applied by using an autoclave, thereby hardening the adhesive layer 9 to fix the film 5 to the window main body 3. The treatment conditions using the autoclave are set as follows: the temperature is 85° C. to 95° C., the pressure is 1.03 MPa, and the treatment time is 1 hour.

The aircraft window member 1 is obtained after being taken out from the autoclave and cooled.

The aircraft window member 1, manufactured as described above, is then fitted into a window frame or the like, thereby obtaining an aircraft window assembly.

According to the aircraft window member 1 of this embodiment, the following advantages are obtained.

The aircraft window member 1 can be simply manufactured just by attaching the film 5 on which the conductive mesh 7 is formed to the window main body 3. Even when the window main body 3 has a curved face, since the film 5 on which the conductive mesh 7 is formed has flexibility, the film 5 can be easily attached to the window main body 3.

Since the window main body 3 and the film 5 are made of acrylic resin to have an equivalent thermal expansion coefficient, hardly any wrinkles occur on the film 5 even when they are heated by the autoclave during manufacturing and cooled thereafter.

Although the aircraft window member 1 is exposed to a large change in temperature during the operation of the aircraft, since there is no difference in thermal expansion coefficient between the window main body 3 and the film 5, peeling of the film almost never occurs, thus improving the durability.

Since urethane adhesive is used as the adhesive layer 9, it is possible to firmly bond the window main body 3 and the film 5, which are made of acrylic resin.

Since urethane adhesive does not include plasticizer, unlike polyvinyl butyral (PVB), even when it directly contacts the copper of the conductive mesh 7, a reaction does not occur and there is no adverse influence on the optical transparency of the window member.

Second Embodiment

Next, a second embodiment of the present invention will be described with reference to FIG. 4.

Figure 4:
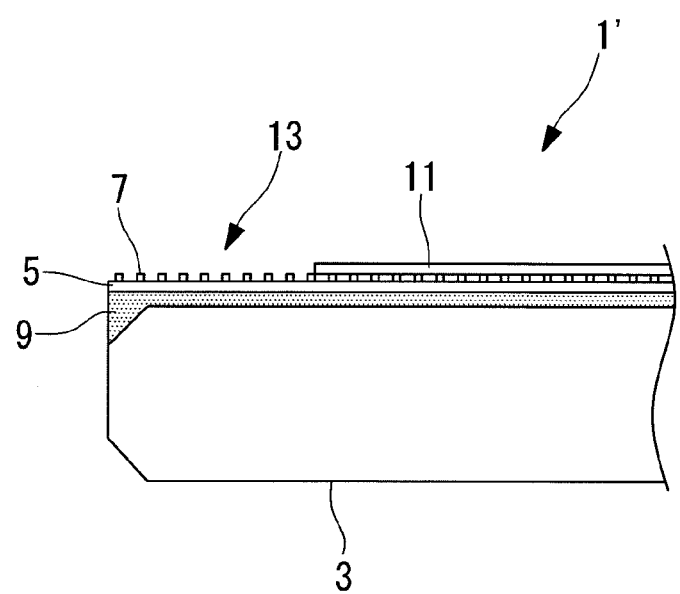
FIG. 4 is a partial cross-sectional view showing an edge portion of an aircraft window member according to a second embodiment of the present invention.

FIG. 4 is a partial cross-sectional view showing an edge portion of an aircraft window member 1' according to this embodiment.

In this embodiment, unlike the first embodiment, when the film 5 on which the conductive mesh 7 is formed is attached to the window main body 3, the conductive mesh 7 faces upward in FIG. 4, instead of facing the window main body 3. Therefore, the window main body 3, the adhesive layer 9, the film 5, and the conductive mesh 7 are laminated in this order from the bottom in FIG. 4. Since the materials and the shapes of the window main body 3, the adhesive layer 9, the film 5, and the conductive mesh 7 are the same as those in the first embodiment, a description thereof will be omitted.

A protective layer 11 for protecting the conductive mesh is laminated on the conductive mesh 7. A film made of acrylic resin is used as the protective layer 11. The conductive mesh 7 and the protective layer 11 are bonded by polyvinyl acetate adhesive.

An exposed region 13 which is not covered with the protective layer 11 is provided at an edge portion of the conductive mesh 7. The exposed region 13 is used to obtain an external electrical connection when the aircraft window member 1' is fitted into a window frame to form a window assembly.

The aircraft window member 1' having the above-described structure is manufactured as follows.

Since a process of forming the conductive mesh 7 on the film 5 is the same as that in the first embodiment, a description thereof will be omitted.

The protective layer 11 is attached to the conductive mesh 7 formed on the film 5.

The film 5 on which the conductive mesh 7 is formed is attached to the window main body 3. At this time, with regard to the window main body 3 on which the sheet-like adhesive layer 9 is placed, the film 5 is brought into contact with the adhesive layer 9, with the conductive mesh 7 facing upward in FIG. 4 instead of facing the window main body 3.

As in the first embodiment, the adhesive layer 9 is thermally-hardened by the autoclave and cooled, thereby obtaining the aircraft window member 1'.

The aircraft window member 1' thus manufactured is then fitted into a window frame or the like, thereby obtaining an aircraft window assembly.

According to the aircraft window member 1' of this embodiment, the following advantages are obtained in addition to the advantages obtained in the first embodiment.

Since the exposed region 13, which is not covered with the protective layer 11, is provided at the edge portion of the conductive mesh 7 when the protective layer 11 is laminated on the conductive mesh 7, the exposed region can be used for an electrical connection. Therefore, when the aircraft window member 1' is fitted into a window frame to form an aircraft window assembly, it is possible to obtain an external electrical connection to reliably shield electromagnetic waves.

In each of the embodiments described above, copper is used as the material of the conductive mesh 7. However, the present invention is not limited to the use of copper. For example, gold, silver, aluminum, nickel, titanium, or tin may be used.

The invention claimed is:

1. An aircraft window member comprising:
 a film made of polymethyl methacrylate resin, and the film has flexibility;
 a conductive mesh disposed on the film, and in which a conductive material is disposed in a mesh shape so as to have optical transparency for ensuring visibility and to have electromagnetic-wave shielding properties; and
 a window main body made of polymethyl methacrylate resin and to which the film on which the conductive mesh is disposed is attached.

2. An aircraft window member according to claim 1, wherein an adhesive layer is disposed between the film on which the conductive mesh is disposed and the window main body; and
 the adhesive layer is made of urethane adhesive.

3. An aircraft window member according to claim 2, wherein the conductive mesh disposed on the film is between the film and the window main body.

4. An aircraft window member according to claim 1, wherein the conductive mesh is above the window main body with the film therebetween; and
 a protective layer is disposed on the conductive mesh so as to provide an exposed region for an electrical connection at an edge portion of the conductive mesh.

5. An aircraft window assembly comprising:
 an aircraft window member according to claim 1; and
 a window frame holding the aircraft window member.

* * * * *